(12) United States Patent
Komatsu et al.

(10) Patent No.: US 10,001,610 B2
(45) Date of Patent: Jun. 19, 2018

(54) OPTICAL MODULE

(71) Applicant: Oclaro Japan, Inc., Sagamihara, Kanagawa (JP)

(72) Inventors: Kazuhiro Komatsu, Tokyo (JP); Daisuke Noguchi, Kanagawa (JP)

(73) Assignee: OCLARO JAPAN, INC., Kanagawa (JP)

( * ) Notice: Subject to any disclaimer, the term of this patent is extended or adjusted under 35 U.S.C. 154(b) by 5 days.

(21) Appl. No.: 15/366,008

(22) Filed: Dec. 1, 2016

(65) Prior Publication Data

US 2017/0168255 A1    Jun. 15, 2017

(30) Foreign Application Priority Data

Dec. 11, 2015 (JP) ................................. 2015-242275

(51) Int. Cl.
  *G02B 6/42* (2006.01)
  *H05K 1/02* (2006.01)
  (Continued)

(52) U.S. Cl.
  CPC ........... *G02B 6/4279* (2013.01); *G02B 6/428* (2013.01); *G02B 6/4245* (2013.01);
  (Continued)

(58) Field of Classification Search
  CPC ......... H05K 2201/10121; H05K 1/111; H05K 1/115; H05K 1/181
  (Continued)

(56) References Cited

U.S. PATENT DOCUMENTS 7,160,039 B2 *   1/2007   Hargis ................. G02B 6/4206
                                                        361/736
8,059,973 B2 *  11/2011   Douma ................ G02B 6/4246
                                                        250/214 R
(Continued)

FOREIGN PATENT DOCUMENTS

CN        101384934 A      3/2009
JP        2007-287767 A   11/2007
JP        2009-302438 A   12/2009

OTHER PUBLICATIONS

Chinese Office Action received in corresponding Chinese Application No. 201611129799.X dated Apr. 8, 2018.

*Primary Examiner* — Dean Takaoka
*Assistant Examiner* — Alan Wong
(74) *Attorney, Agent, or Firm* — Mattingly & Malur, P.C.

(57) ABSTRACT

A plurality of leads include a pair of differential signal leads for inputting differential signals, and a power supply lead for supplying power. A wiring pattern includes a pair of differential transmission lines connected to the pair of differential signal leads, and a power supply wiring connected to the power supply lead. A wiring board includes a first region overlapping an optical subassembly, and a second region extending from the first region so as to protrude from the optical subassembly. The pair of differential signal leads are farther away from the second region than the power supply lead. The pair of differential transmission lines are close together so as to be electromagnetically coupled to each other. The optical subassembly does not include a lead penetrating the wiring board in a region between the pair of differential transmission lines.

8 Claims, 5 Drawing Sheets

(51) Int. Cl.
*H01L 31/02* (2006.01)
*H05K 1/11* (2006.01)
*H05K 1/18* (2006.01)
*H05K 3/34* (2006.01)

(52) U.S. Cl.
CPC ......... *G02B 6/4246* (2013.01); *G02B 6/4263* (2013.01); *H05K 1/0245* (2013.01); *H05K 1/111* (2013.01); *H05K 1/181* (2013.01); *G02B 6/4238* (2013.01); *H05K 1/118* (2013.01); *H05K 3/3447* (2013.01); *H05K 2201/10121* (2013.01)

(58) Field of Classification Search
USPC ............... 361/777; 174/250, 261; 385/31; 398/135, 164
See application file for complete search history.

(56) References Cited

U.S. PATENT DOCUMENTS

| | | | |
|---|---|---|---|
| 8,106,408 B2 | 1/2012 | Ban et al. | |
| 8,437,583 B2 * | 5/2013 | Ban | G02B 6/4201 385/14 |
| 8,633,399 B2 * | 1/2014 | Kagaya | H01P 1/02 174/250 |
| 8,676,058 B2 * | 3/2014 | Kagaya | H01P 3/026 333/238 |
| 9,265,140 B2 * | 2/2016 | Han | H05K 1/0251 |
| 2007/0003194 A1 | 1/2007 | Ueno et al. | |
| 2007/0201881 A1 | 8/2007 | Douma | |
| 2010/0006863 A1 | 1/2010 | Ban et al. | |
| 2012/0057879 A1 | 3/2012 | Douma | |

* cited by examiner

OPTICAL MODULE

CROSS-REFERENCE TO RELATED APPLICATION

The present application claims priority from Japanese application JP2015-242275 filed on Dec. 11, 2015, the content of which is hereby incorporated by reference into this application.

BACKGROUND OF THE INVENTION

1. Field of the Invention

The present invention relates to an optical module.

2. Description of the Related Art

A CAN-type optical module (also referred to as "optical subassembly" (OSA)) used in optical communications includes a CAN-type optical package in which an optical semiconductor device that performs photoelectric conversion is mounted, and a flexible board for electrically connecting the CAN-type optical package with a main board (JP 2009-302438 A and JP 2007-287767 A). On the flexible board, a pair of differential transmission lines are provided close together so that the pair of differential transmission lines are electromagnetically coupled together to obtain desired characteristic impedance.

The flexible board is extracted so as to protrude from the CAN-type optical package. By providing a GND lead pin at a position serving as a bend stop in the protruding portion, the bending of the flexible board can be prevented to thereby prevent disconnection of a wiring such as the differential transmission line. That is, the GND lead pin is provided at a position close to the protruding portion of the flexible board in a region where the flexible board overlaps the CAN-type optical package.

However, when the GND lead pin is provided at this position, the pair of differential transmission lines are away from each other with the GND lead pin interposed therebetween, and each of the pair of differential transmission lines becomes an independent transmission line. For example, the line width of the transmission line needs to be changed to match impedance; however, such a change point constitutes a factor for impedance mismatch, finally leading conceivably to adverse effects on characteristics. Therefore, the pair of differential transmission lines are desirably routed to connection terminals in the state where the pair of differential transmission lines are close together as much as possible.

SUMMARY OF THE INVENTION

It is an object of the invention to provide an optical module with good high-frequency characteristics.

(1) An optical module according to an aspect of the invention includes: an optical subassembly including a plurality of leads and being for converting an optical signal and an electric signal at least from one to the other; and a wiring board including a wiring pattern and overlapping and electrically connected to the optical subassembly, wherein the plurality of leads include a pair of differential signal leads for receiving differential signals, and a power supply lead for supplying power, the wiring pattern includes a pair of differential transmission lines connected to the pair of differential signal leads, and a power supply wiring connected to the power supply lead, the wiring board includes a first region overlapping the optical subassembly, and a second region extending from the first region so as to protrude from the optical subassembly, the pair of differential signal leads are farther away from the second region than the power supply lead, the pair of differential transmission lines are close together so as to be electromagnetically coupled to each other, and the optical subassembly does not include a lead penetrating the wiring board in a region between the pair of differential transmission lines. According to the aspect of the invention, since the pair of differential signal leads are farther away from the second region (region protruding from the optical subassembly) than the power supply lead, the power supply lead serves as a bend stop of the wiring board. The pair of differential transmission lines are prone to disconnection when bent at bonding portions to the pair of differential signal leads. However, the power supply lead serves as a bend stop of the wiring board, so that disconnection is prevented. Moreover, the pair of differential transmission lines are not away from each other because of the absence of the lead in the region therebetween. Therefore, there is no impedance mismatch, and thus high-frequency characteristics are good.

(2) The optical module according to (1), wherein the power supply wiring may include a bypassing portion extending from the power supply lead so as to go therearound while avoiding a direction of the shortest distance from the power supply lead to the second region.

(3) The optical module according to (2), wherein the optical module may further include solder bonding the power supply wiring and the power supply lead together, the power supply wiring may further include a pad extending in the direction of the shortest distance from the power supply lead to the second region, the power supply lead may penetrate the pad, and the solder may be disposed on the pad.

(4) The optical module according to (3), wherein the optical module may further include a cover layer covering the wiring pattern except for a portion thereof, the power supply wiring may include, in the first region, a boundary between a portion covered by the cover layer and a portion exposed from the cover layer, the pad may include, in the first region, a tip closest to the second region, and the boundary of the power supply wiring may be located at a position farther away from the second region than the tip of the pad.

(5) The optical module according to any one of (1) to (4), wherein the pitch of the pair of differential signal leads may be larger than the pitch of the pair of differential transmission lines in the second region.

(6) The optical module according to (5), wherein the pair of differential transmission lines may extend from the pair of differential signal leads in a direction close to each other without extending in a direction away from each other.

(7) The optical module according to any one of (1) to (6), wherein the wiring board may further include a ground plane insulated from and overlapping the pair of differential transmission lines, and the plurality of leads may further include a ground lead connected to the ground plane.

(8) The optical module according to (7), wherein the wiring board may include a notch portion provided between the differential signal lead and the power supply lead, the wiring pattern may include a ground wiring pattern continuous from the ground lead to the notch portion, and the ground wiring pattern may be electrically connected with the optical subassembly through solder provided at the notch portion.

DETAILED DESCRIPTION OF THE INVENTION

Figure 1:
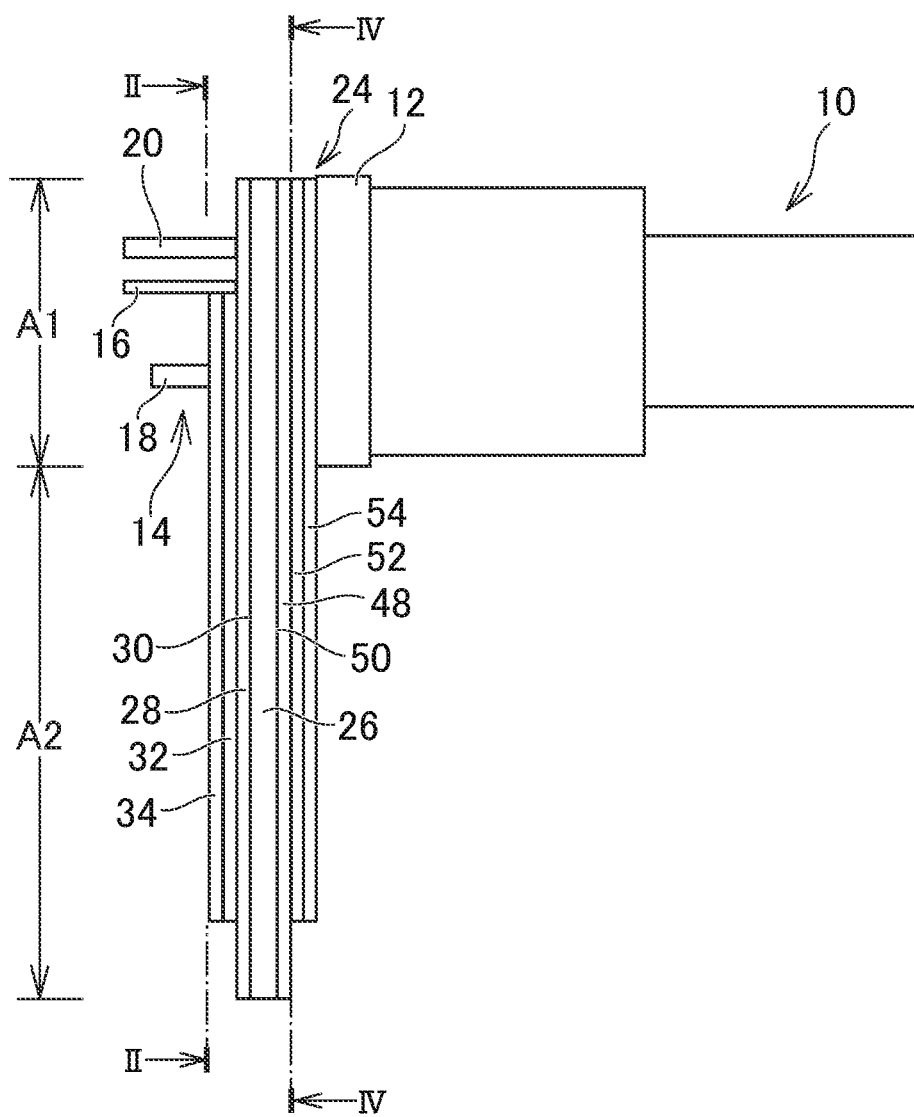
FIG. 1 is a cross-sectional view showing an overview of an optical module according to an embodiment of the invention.
Figure 2:
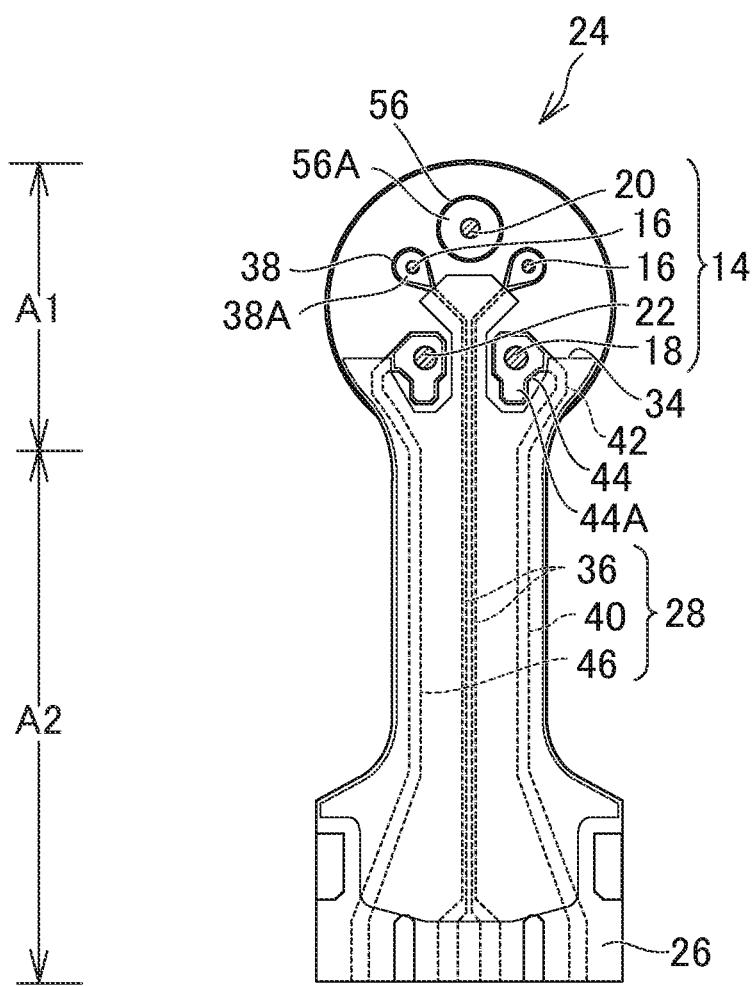
FIG. 2 is a cross-sectional view of the optical module shown in FIG. 1, taken along line II-II.

Hereinafter, an embodiment of the invention will be described with reference to the drawings. FIG. 1 is a cross-sectional view showing an overview of an optical module according to the embodiment of the invention. FIG. 2 is a cross-sectional view of the optical module shown in FIG. 1, taken along line II-II.

The optical module includes an optical subassembly 10. One example of the optical subassembly 10 is an optical transmitter module (transmitter optical subassembly (TOSA)) that includes a light-emitting element such as a laser therein, converts an electric signal to an optical signal, and transmits the optical signal to an optical fiber connected with an optical connector. Another example is an optical receiver module (receiver optical subassembly (ROSA)) that includes a light-receiving element typified by a photodiode therein and converts the optical signal received through the optical connector to the electric signal. Alternatively, a bidirectional optical subassembly (BOSA) having the functions of TOSA and ROSA is also another example of the optical subassembly 10. As described above, the optical subassembly 10 is configured to convert an electric signal and an optical signal at least from one to the other.

The optical subassembly 10 includes, as connection terminals, a plurality of leads 14 (specifically lead pins) that project from a stem 12. The plurality of leads 14 project in the same direction and extend in parallel to each other. The plurality of leads 14 include a pair of differential signal leads 16 for inputting differential signals (high-frequency signals). The plurality of leads 14 include a power supply lead 18 for supplying power and a ground lead 20 for grounding. When the optical subassembly 10 includes a light-receiving element, the plurality of leads 14 may include a DC lead 22 to flow a direct current corresponding to the average value of high-frequency components of an electric current flowing through the light-receiving element or may include a plurality of the power supply leads 18.

The optical module includes a wiring board 24 (e.g., a flexible board). The wiring board 24 includes a first region A1 overlapping the optical subassembly 10 and a second region A2 extending from the first region A1 so as to protrude from the optical subassembly 10. The wiring board 24 includes a base film 26 made of an organic material (insulating material) such as polyimide resin. The wiring board 24 includes a wiring pattern 28 for electrically connecting to the optical subassembly 10. The wiring pattern 28 is formed on a first face 30 of the base film 26. The wiring pattern 28 is covered, except for a portion thereof, by a first cover layer 34 through a first adhesive layer 32. The first cover layer 34 is also made of an organic material (insulating material) such as polyimide resin.

The wiring pattern 28 includes a pair of differential transmission lines 36. The pair of differential transmission lines 36 are close together so as to be electromagnetically coupled to each other so that desired characteristic impedance is provided. The pair of differential transmission lines 36 are connected to the pair of differential signal leads 16. Specifically, the differential transmission line 36 includes a signal pad 38 at an end portion, and the differential signal lead 16 is disposed so as to penetrate the signal pad 38. The signal pad 38 is provided with solder 38A. The signal pad 38 and the differential signal lead 16 are bonded together with the solder 38A and electrically connected together. The pair of differential transmission lines 36 have the maximum pitch at the signal pads 38 and extend from the pair of differential signal leads 16 in a direction close to each other without extending in a direction away from each other. The pitch of the pair of differential signal leads 16 is larger than the pitch of the straight portions of the pair of differential transmission lines 36 in the second region A2.

The wiring pattern 28 includes a power supply wiring 40 connected to the power supply lead 18. The power supply wiring 40 includes a bypassing portion 42. The bypassing portion 42 extends from the power supply lead 18 so as to go therearound while avoiding the direction of the shortest distance from the power supply lead 18 to the second region A2. The power supply wiring 40 includes a power supply pad 44. The power supply lead 18 penetrates the power supply pad 44, and solder 44A is disposed on the power supply pad 44. The solder 44A bonds the power supply pad 44 and the power supply lead 18 together.

Figure 3:
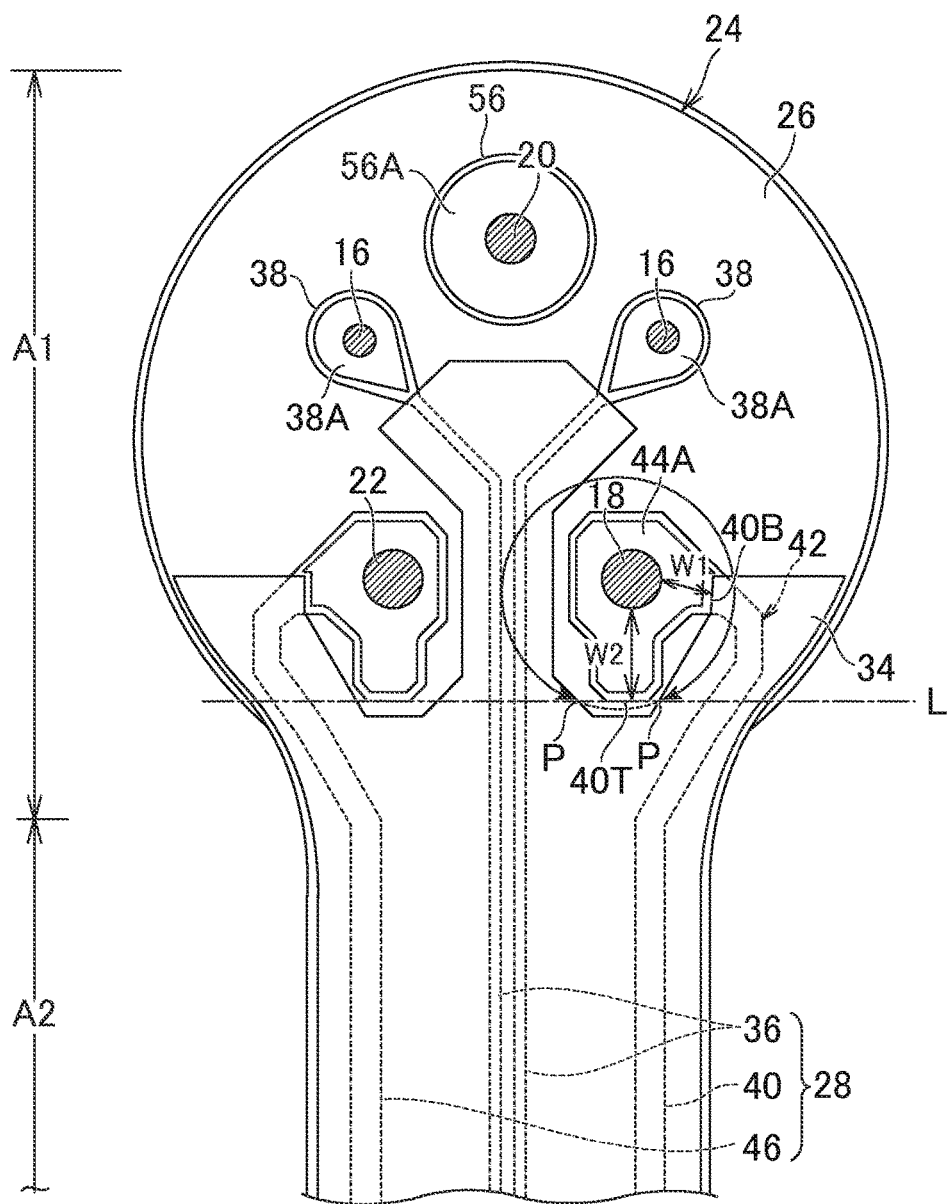
FIG. 3 is an enlarged view for illustrating the details of a power supply wiring.

FIG. 3 is an enlarged view for illustrating the details of the power supply wiring 40. The power supply pad 44 is less likely to bend because of the solder 44A disposed thereon, and therefore, the wiring board 24 is likely to bend at a position adjacent to a portion of the power supply pad 44 on which the solder 44A is disposed. Since there are a pair of power supply pads 44, the wiring board 24 is likely to bend at a straight line (dash-dotted line L shown in FIG. 3) adjacent to the pair of power supply pads 44.

The power supply wiring 40 includes, in the first region A1, a boundary 40B between a portion covered by the first cover layer 34 and a portion exposed from the first cover layer 34. The power supply pad 44 extends in the direction of the shortest distance from the power supply lead 18 to the second region A2, and includes, in the first region A1, a tip 40T closest to the second region A2. The position at which the wiring board 24 is likely to bend is located adjacent to this tip 40T.

In the embodiment, the boundary 40B between the exposed and covered portions of the power supply wiring 40 is located at a position farther away from the second region A2 than the tip 40T of the power supply pad 44. That is, the power supply wiring 40 is covered by the first cover layer 34 at the position (the dash-dotted line L) at which the wiring board 24 is likely to bend, and therefore is less prone to disconnection.

In FIG. 3, intersection points P of the outline (boundary line between the regions with and without the first cover layer 34) of the first cover layer 34 and the straight line (the dash-dotted line L) at which the wiring board 24 is likely to bend are shown. When a circle passing through the intersection points P and centered on the central point (intersection point of a plane including the surface of the power supply pad 44 and the central axis) of the power supply lead 18 is drawn, the power supply wiring 40 (the bypassing portion 42) is extracted from the power supply pad 44 within the range (range of the arrows) of the arc between the two intersection points P on the side closer to the pad than the dash-dotted line L, and therefore, the risk of disconnection of the power supply wiring 40 is reduced.

In the embodiment, in the power supply pad 44, a width W2 in the direction of the shortest distance from the power supply lead 18 to the second region A2 is larger than a width W1 in a direction in which the power supply wiring 40 is extracted from the power supply lead 18. Therefore, the circle described above is large, that is, the arc shown by the arrows is lengthened, and the range in the extracted direction in which the risk of disconnection is reduced is widened. This configuration improves design flexibility and therefore is effective when, for example, a component such as another wiring is close to the power supply wiring 40. Moreover, by extracting the power supply wiring 40 away from both ends of the arc, the boundary 40B between the exposed and covered portions of the power supply wiring 40 can be away from the straight line (the dash-dotted line L) at which the wiring board 24 is likely to bend, and therefore, resistance to disconnection is improved.

As shown in FIG. 2, the pair of differential signal leads 16 are farther away from the second region A2 than the power supply lead 18. Conversely, the power supply lead 18 penetrates the wiring board 24, which can stop the bending of the wiring board 24. The pair of differential transmission lines 36 are prone to disconnection when bent at bonding portions (specifically portions adjacent to the solder 38A) to the pair of differential signal leads 16. However, the power supply lead 18 serves as a bend stop of the wiring board 24, and the pair of differential transmission lines 36 are covered by the first cover layer 34 in the range from the power supply lead 18 to the second region A2 side, so that disconnection is prevented.

In the embodiment, the optical subassembly 10 does not include a lead that penetrates the wiring board 24 in a region between the pair of differential transmission lines 36. That is, the pair of differential transmission lines 36 are not away from each other because of the absence of the lead in the region therebetween. Therefore, a change in the confinement state of the electromagnetic field between the pair of differential transmission lines 36 can be suppressed, impedance mismatch hardly occurs, and thus high-frequency characteristics are good.

The wiring pattern 28 includes a DC wiring 46 connected to the DC lead 22. The DC wiring 46 and the power supply wiring 40 form a line-symmetrical shape with the pair of differential transmission lines 36 interposed between the DC wiring 46 and the power supply wiring 40, and therefore, the description of the power supply wiring 40 is applied to the structure of the DC wiring 46.

Figure 4:
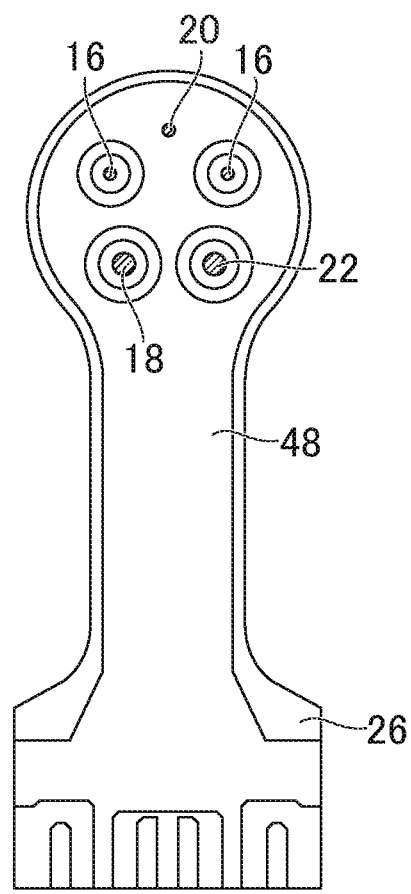
FIG. 4 is a cross-sectional view of the optical module shown in FIG. 1, taken along line IV-IV.

FIG. 4 is a cross-sectional view of the optical module shown in FIG. 1, taken along line IV-IV. As shown in FIGS. 1 and 4, the wiring board 24 includes a ground plane 48. The ground plane 48 is formed on a second face 50 of the base film 26. The ground plane 48 is covered, except for a portion thereof, by a second cover layer 54 through a second adhesive layer 52. The second cover layer 54 is also made of an organic material (insulating material) such as polyimide resin. The ground plane 48 is insulated from and overlaps the pair of differential transmission lines 36 (see FIG. 2), and is connected to the ground lead 20, whereby a microstrip line is configured. Specifically, a ground land 56 (see FIG. 2) provided in the same layer as the wiring pattern 28 electrically conducts to the ground plane 48 through a through hole (not shown) penetrating the base film 26; the ground lead 20 penetrates the ground land 56; and the ground lead 20 and the ground land 56 are bonded and electrically connected together with solder 56A provided on the ground land 56.

Figure 5:
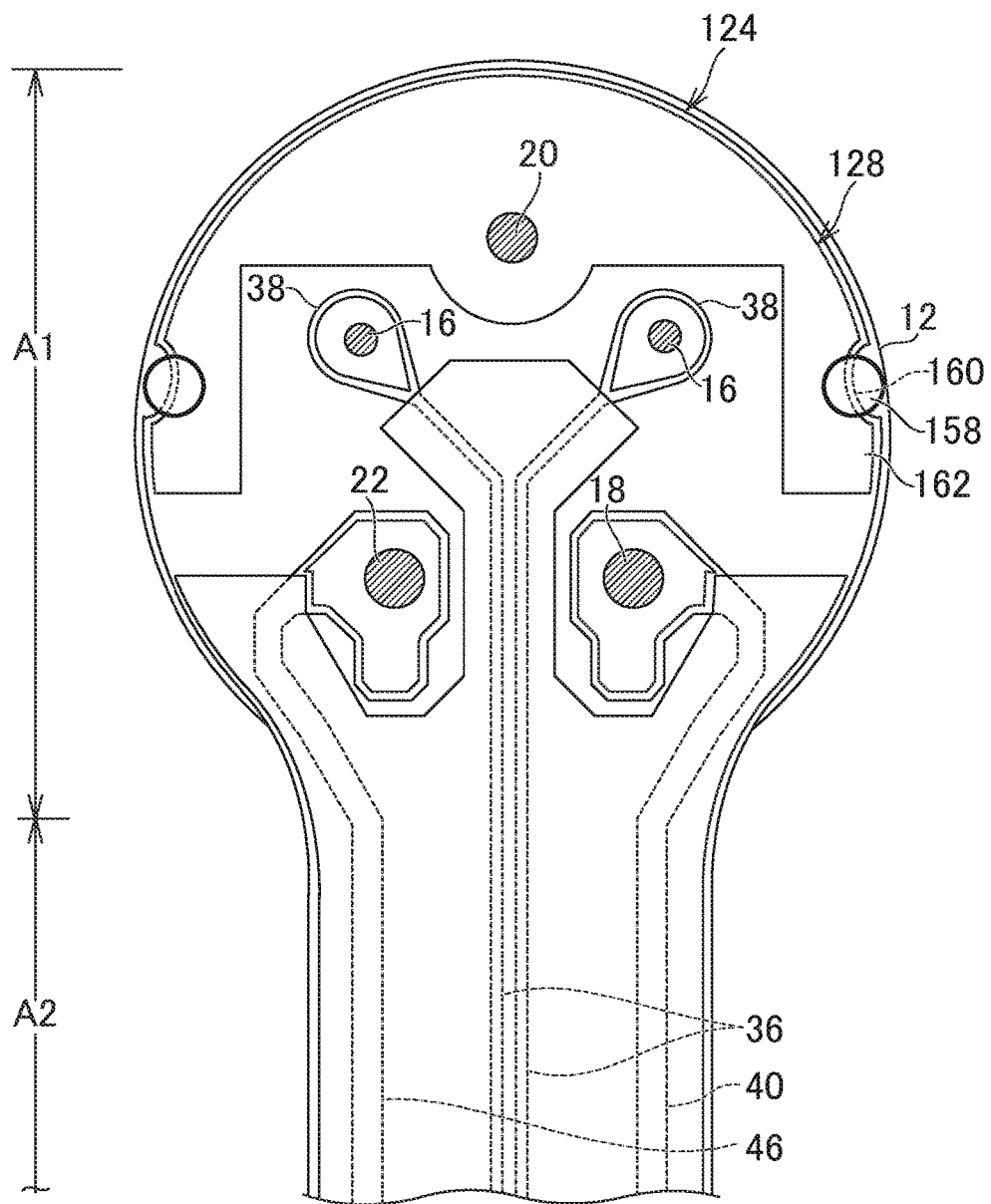
FIG. 5 is a diagram showing a modified example of the embodiment, corresponding to FIG. 3.

FIG. 5 is a diagram showing a modified example of the embodiment, corresponding to FIG. 3. The modified example differs from the embodiment shown in FIG. 3 in that a wiring pattern 128 of a wiring board 124 and the stem 12 are directly connected with solder 158; however, in other respects, the modified example is the same as the embodiment described above. In the modified example, notch portions 160 are provided in portions of the wiring board 124. The notch portion 160 is connected with the ground lead 20 through a ground wiring pattern 162 as a portion of the wiring pattern 128. By providing the solder 158 at the notch portion 160 so as to be in contact with the stem 12, the ground wiring pattern 162 and the stem 12 conduct to each other at the ground potential. The ground wiring pattern 162 surrounds the differential signal leads 16 in three directions excluding the direction in which the differential transmission lines 36 are extracted (the direction of the second region A2 in FIG. 5). By employing the structure, portions of the differential transmission lines 36 and the differential signal leads 16 can be surrounded with the ground potential, and thus it is possible to provide the optical module with excellent high-frequency characteristics.

Then, as described in the embodiment, the DC lead 22 is provided on the side close to the second region A2, and the differential signal leads 16 and the ground lead 20 are disposed in this order in a direction from the DC lead 22 toward the first region A1. By doing this, since a wiring pattern can be eliminated between the differential signal lead 16 and the DC lead 22, the notch portion 160 can be provided therebetween, and by connecting the notch portion 160 with the stem 12 in this region, the differential transmission lines 36 and the differential signal leads 16 can be surrounded with the ground potential as described above.

The ground lead 20 and the notch portions 160 are connected on the wiring pattern 128 side in the modified example, but may be connected through the ground plane on the opposite side. Moreover, the notch is referred to as "notch portion" in the embodiment, but may be a hole such as a through hole.

While there have been described what are at present considered to be certain embodiments of the invention, it will be understood that various modifications may be made thereto, and it is intended that the appended claims coverall such modifications as fall within the true spirit and scope of the invention.

What is claimed is:
1. An optical module comprising:
   an optical subassembly including a plurality of leads and being for converting an optical signal and an electric signal at least from one to the other; and
   a wiring board including a wiring pattern and overlapping and electrically connected to the optical subassembly, wherein
   the plurality of leads include a pair of differential signal leads for inputting differential signals, and a power supply lead for supplying power,
   the wiring pattern includes a pair of differential transmission lines connected to the pair of differential signal leads, and a power supply wiring connected to the power supply lead,
   the wiring board includes a first region overlapping the optical subassembly, and a second region extending from the first region so as to protrude from the optical subassembly,
   the pair of differential signal leads are farther away from the second region than the power supply lead,
   the pair of differential transmission lines are close together so as to be electromagnetically coupled to each other, and the optical subassembly does not include a lead penetrating the wiring board in a region between the pair of differential transmission lines.

2. The optical module according to claim 1, wherein the power supply wiring includes a bypassing portion extending from the power supply lead so as to go therearound while avoiding a direction of the shortest distance from the power supply lead to the second region.

3. The optical module according to claim 2, further comprising solder bonding the power supply wiring and the power supply lead together, wherein the power supply wiring further includes a pad extending in the direction of the shortest distance from the power supply lead to the second region, the power supply lead penetrates the pad, and the solder is disposed on the pad.

4. The optical module according to claim 3, further comprising a cover layer covering the wiring pattern except for a portion thereof, wherein the power supply wiring includes, in the first region, a boundary between a portion covered by the cover layer and a portion exposed from the cover layer, the pad includes, in the first region, a tip closest to the second region, and the boundary of the power supply wiring is located at a position farther away from the second region than the tip of the pad.

5. The optical module according to claim 1, wherein the pitch of the pair of differential signal leads is larger than the pitch of the pair of differential transmission lines in the second region.

6. The optical module according to claim 5, wherein the pair of differential transmission lines extend from the pair of differential signal leads in a direction close to each other without extending in a direction away from each other.

7. The optical module according to claim 1, wherein the wiring board further includes a ground plane insulated from and overlapping the pair of differential transmission lines, and the plurality of leads further include a ground lead connected to the ground plane.

8. The optical module according to claim 7, wherein the wiring board includes a notch portion provided between the differential signal lead and the power supply lead, the wiring pattern includes a ground wiring pattern continuous from the ground lead to the notch portion, and the ground wiring pattern is electrically connected with the optical subassembly through solder provided at the notch portion.

* * * * *